United States Patent
Cho et al.

(10) Patent No.: US 8,295,097 B2
(45) Date of Patent: Oct. 23, 2012

(54) CHANNEL PRECHARGE AND PROGRAM METHODS OF A NONVOLATILE MEMORY DEVICE

(75) Inventors: ByungKyu Cho, Seoul (KR); Kwang Soo Seol, Yongin-si (KR); Sunghoi Hur, Seoul (KR); Jungdal Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 324 days.

(21) Appl. No.: 12/795,196

(22) Filed: Jun. 7, 2010

(65) Prior Publication Data

US 2011/0090744 A1    Apr. 21, 2011

(30) Foreign Application Priority Data

Oct. 15, 2009  (KR) .................. 10-2009-0098377

(51) Int. Cl.
*G11C 16/06* (2006.01)
*G11C 16/04* (2006.01)

(52) U.S. Cl. .......... 365/185.25; 365/185.18; 365/185.28
(58) Field of Classification Search .................. None
See application file for complete search history.

(56) References Cited

U.S. PATENT DOCUMENTS

| | | | | |
|---|---|---|---|---|
| 5,940,321 A * | 8/1999 | Takeuchi et al. | ......... | 365/185.17 |
| 6,587,375 B2 * | 7/2003 | Chung et al. | ............. | 365/185.13 |
| 6,859,394 B2 * | 2/2005 | Matsunaga et al. | ...... | 365/185.17 |
| 6,907,497 B2 * | 6/2005 | Hosono et al. | ................ | 711/103 |
| 6,987,694 B2 * | 1/2006 | Lee | ......................... | 365/185.17 |
| 7,184,308 B2 * | 2/2007 | Kwon et al. | ............. | 365/185.17 |
| 7,355,888 B2 | 4/2008 | Hemink et al. | | |
| 7,355,889 B2 | 4/2008 | Hemink et al. | | |
| 7,511,996 B2 * | 3/2009 | Kim | ......................... | 365/185.02 |
| 7,672,169 B2 * | 3/2010 | Ueno | ....................... | 365/185.25 |
| 2008/0137409 A1 | 6/2008 | Nakamura et al. | | |

FOREIGN PATENT DOCUMENTS

| | | |
|---|---|---|
| JP | 2008-135100 A | 6/2008 |
| KR | 10-2008-0022943 A | 3/2008 |
| KR | 10-2008-0048419 A | 6/2008 |
| KR | 10-2008-0089426 A | 10/2008 |

* cited by examiner

*Primary Examiner* — Tan T. Nguyen
(74) *Attorney, Agent, or Firm* — Lee & Morse, P.C.

(57) ABSTRACT

A channel pre-charge method of a nonvolatile memory device including a cell string includes pre-charging a channel of the cell string according to a first word line bias condition and pre-charging the channel of the cell string according to a second word line bias condition, different than the first word line bias condition.

20 Claims, 15 Drawing Sheets

(Vneg : 0V or less than 0V)

(Vneg : 0V or less than 0V)

(Vneg : 0V or less than 0V)

(Vneg : 0V or less than 0V)

(Vneg1 > Vneg2)

CHANNEL PRECHARGE AND PROGRAM METHODS OF A NONVOLATILE MEMORY DEVICE

BACKGROUND

1. Field

Example embodiments relate to a method of channel pre-charge and program operation of a nonvolatile memory device, and, more particularly, to a method of two-step channel pre-charge and program operation of a nonvolatile memory device.

2. Description of Related Art

Semiconductor memory devices are generally the most inevitable micro electronic parts for digital logic devices, e.g., a computer and a microprocessor used in applications ranging from a satellite to a consumer electronic product. Therefore, improving manufacturing technology of semiconductor memory devices, including process and technique development acquired through scale-down for high integration and high speed, has helped to improve performance criteria of other digital logic devices.

Semiconductor memory devices are largely divided into volatile semiconductor memory devices and nonvolatile semiconductor memory devices. In volatile memory devices, information is stored by setting logic state of bi-stable flip-flop in case of SRAM and by charging a capacitor in case of DRAM. Also, volatile memory devices can store and read data only while power is supplied, i.e., lose data when power is removed. In contrast, nonvolatile memory devices, e.g., MROM, PROM, EPROM, EEPROM, etc. can store data even when power is removed. Data state in nonvolatile memory devices may be stored permanently or may be reprogrammed according to manufacturing process. Reprogrammable non-volatile semiconductor memory devices have been used to store data and program code in wide range of applications, e.g., computer, avionics, telecommunication, and consumer electronic technique industry.

In nonvolatile memory devices including flash memory devices, bit line pre-charge operation is often required to avoid a program disturbance phenomenon. The bit line pre-charge operation uses a power supply voltage to pre-charge bit lines according to data to be programmed. However, as the memory devices are designed to consume less power, i.e., the power supply voltage is decreased, inadequate pre-charging may occur, resulting in a program disturbance phenomenon.

SUMMARY

Embodiments are therefore directed to channel precharge and program methods for a semiconductor memory device, which substantially overcome one or more of the problems due to the limitations and disadvantages of the related art.

It is therefore a feature of an embodiment to provide channel precharge and program methods that reduce or prevent a program disturbance phenomenon.

It is therefore another feature of an embodiment to provide channel precharge and program methods that use more than one word line bias condition.

At least one of the above and other features and advantages may be realized by providing a channel pre-charge method of a nonvolatile memory device including a cell string, the method including pre-charging a channel of the cell string according to a first word line bias condition and pre-charging the channel of the cell string according to a second word line bias condition that is different than the first word line bias condition.

At least one of the above and other features and advantages may be realized by providing a program method of a nonvolatile memory device including a plurality of cell strings, each cell sting being connected to a bit line and including a plurality memory cells connected in series to a corresponding bit line through a selection transistor, each selection transistor being connected to a corresponding word line, the method including moving electrons from each channel of the cell strings to the corresponding bit line according to data to be programmed under a first word line bias condition, moving additional electrons to the corresponding bit line under a second word line bias condition that is different than the first word line bias condition and controls voltages of all or some of the word lines, and supplying a program voltage and a pass voltage to selected word lines and non-selected word lines, respectively.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0098377, filed on Oct. 15, 2009, in the Korean Intellectual Property Office, and entitled: "Channel Precharge and Program Methods of Nonvolatile Memory Device," is incorporated by reference herein in its entirety.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
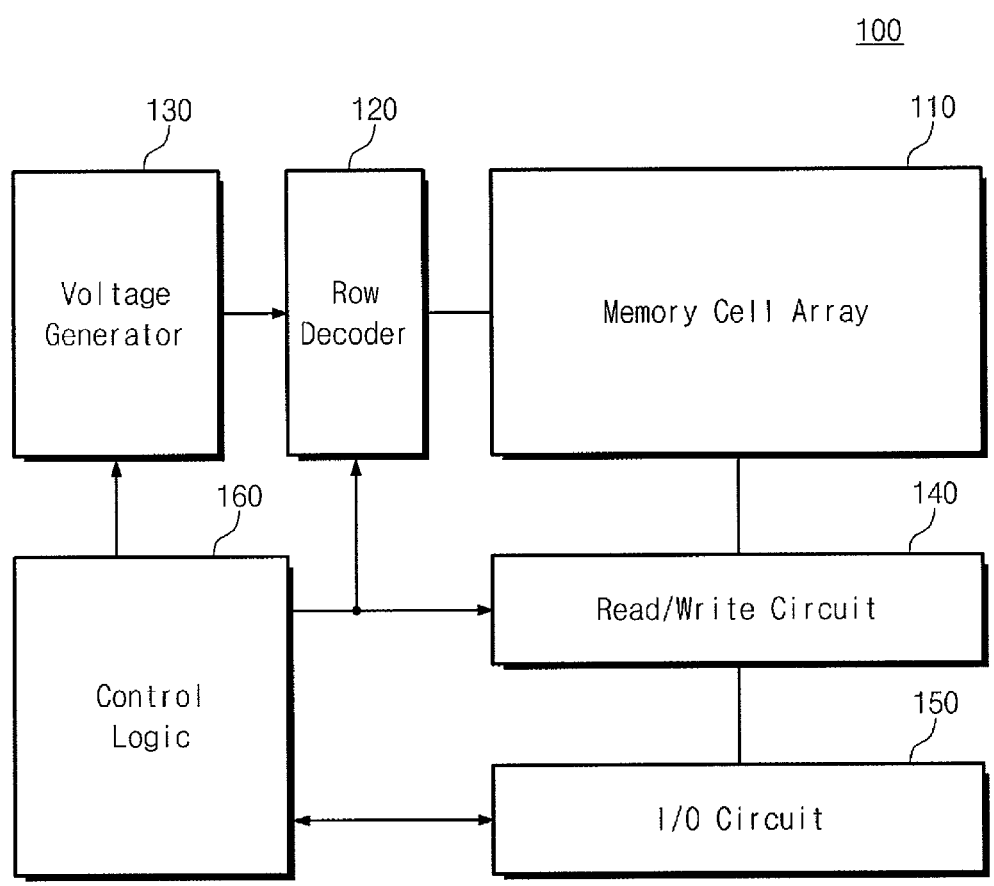
FIG. 1 illustrates a block diagram of a flash memory device according to one example embodiment.

FIG. 1 illustrates a block diagram of a flash memory device according to one example embodiment. Referring to FIG. 1, the flash memory device 100 includes a memory cell array 110, a row decoder 120, a voltage generator 130, a read/write circuit 140, an Input/Output (I/O) circuit 150, and control logic 160.

The memory cell array 110 includes a plurality of memory cells in which data is stored. Each memory cell may store 1-bit data or M-bit data called multi-bit data (M is an integer being 2 or more). Each memory cell may be constructed to have a storage element, e.g., a floating gate or a charge trap layer, or a variable resistance element, e.g., a phase change material or a metal oxide material. The memory cell array 110 may be a single layer structure, i.e., a 2-dimensional array structure, or a multi layer structure, i.e., a 3-dimensional array structure.

The row decoder 120 selects a row line (or word line) of the memory array 110 and drives the selected row line. The row decoder 120 may drive the selected row line with a positive voltage or a negative voltage according to an operation mode under the control of the control logic 160.

The voltage generator 130 is controlled by the control logic 160 and is configured to generate various voltages (e.g., a program voltage, a read voltage, a negative voltage, etc.) to be supplied to the memory cell array 110.

The read/write circuit 140 is controlled by the control logic 160 and is configured to function as a sense amplifier or a write driver according to an operation mode. For example, the read/write circuit 140 operates as a sense amplifier that senses data from the memory cell array 110 during a read operation and as a write driver that drives program data to the memory cell array 110 during a program operation. The read/write circuit 140 drives a supply voltage as a program inhibit voltage or a ground voltage as a program voltage to column lines (or bit lines) associated with the selected word line according to program data.

The I/O circuit 150 is controlled by the control logic 160 and configured to interface program data or read data between the read/write circuit 140 and an external device.

The control logic 160 is configured to control overall operations of the flash memory device 100. Specially, the control logic 160 controls a program operation according to a two-step channel pre-charge scheme in accordance with embodiments. As will be explained below, the two-step channel pre-charge scheme may be used to increase a voltage of a channel to be pre-charged for the program operation. In the program operation, a decrease in the channel voltage of the memory cell to be prohibited from being programmed may cause program-inhibited memory cells to be programmed. That is, as the supply voltage decreases, i.e., as the nonvolatile memory devices consume less power, the probability that a program disturbance phenomenon occurs increases. In accordance with embodiments, a program disturbance phenomenon may be reduced or prevented using the two-step precharge scheme according to example embodiments.

Figure 2:
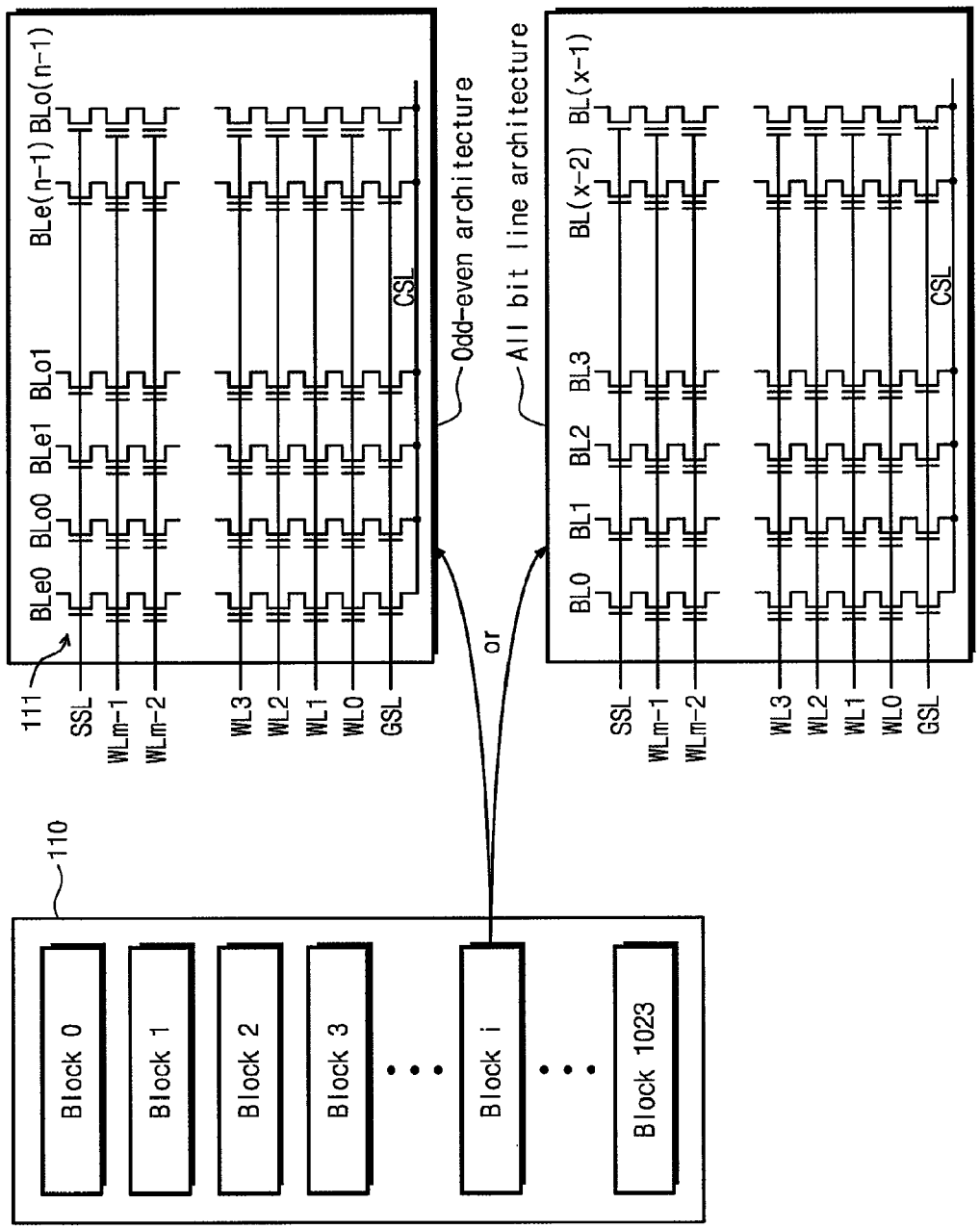
FIG. 2 illustrates an example of memory array including a plurality of memory blocks, which may be arranged in an all bit line structure or odd-even bit line structure, in accordance with one example embodiment.

FIG. 2 illustrates an example of a memory cell array 110 including a plurality of memory blocks. Each memory block may be constructed as an all bit line structure or odd-even bit line structure, in accordance with one example embodiment. For example, the memory cell array 110 may include 1024 memory blocks. Data stored in each of the memory blocks may be erased at the same time. The memory block is referred to as a minimum unit of memory cells that may be erased simultaneously. Each memory block may include a plurality of columns each corresponding to a plurality bit lines (e.g., 1 KB bit lines). In exemplary embodiments, a plurality of memory cells coupled to a bit line in series form a NAND cell string. One end of the NAND cell string is connected to a corresponding bit line through a string selection transistor controlled by a string selection line SSL. The other end of the NAND cell string is connected to a common source line CSL through a ground selection transistor controlled by a ground selection line GSL. The plurality of memory cells between the string selection transistor and the ground selection transistor are controlled by corresponding word lines WL0 to WLm−1, respectively.

In the all bit line ABL architecture, all bit lines are selected simultaneously during a read or program operation. Memory cells connected to a common word line and connected to all the bit lines are also programmed at the same time. In the odd-even bit line architecture, bit lines include even bit lines BLe and odd bit lines BLo. In the odd/even bit line structure, memory cells in a common word line connected with odd bit lines are programmed a first time, while memory cells in the common word line connected with even bit lines are programmed a second time. Data may be programmed or read to or from other memory blocks simultaneously.

In exemplary embodiment, the plurality of memory blocks in the memory cell array 110 may be arranged to have the two-dimensional structure and the three-dimensional structure.

Figure 3:
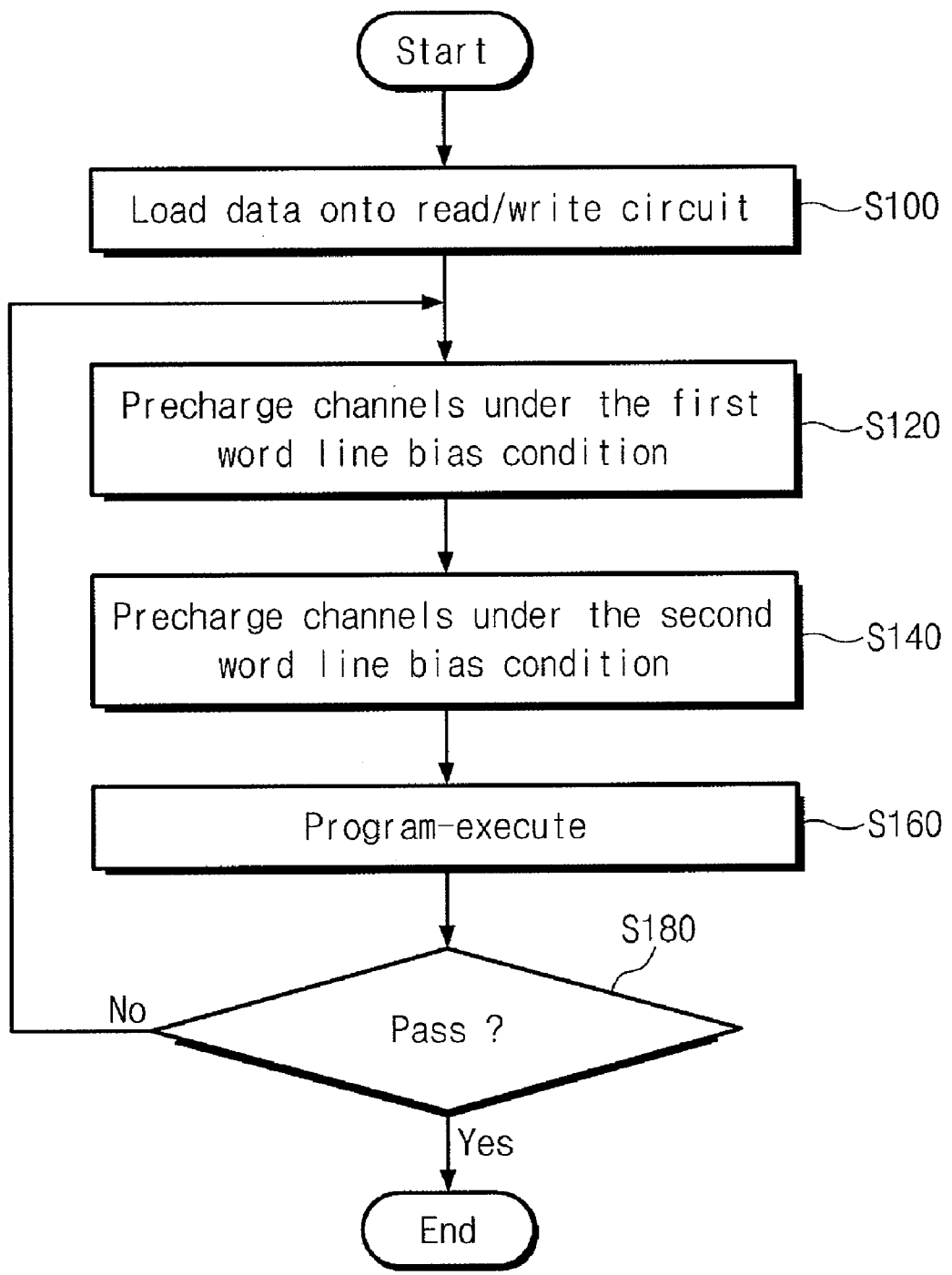
FIG. 3 illustrates a flowchart of a program operation of the nonvolatile memory device in accordance with one example embodiment.

FIG. 3 illustrates a flowchart of a program operation of a flash memory device in accordance with one example embodiment. Hereinafter, a program method of the flash memory device according to an example embodiment will be explained in detail with reference to the reference drawings.

First, in operation S100, data to be programmed is loaded onto a read/write circuit 140 under the control of the control logic 160. The read/write circuit 140 includes page buffers, each of which is connected to a corresponding bit line or a corresponding pair of bit lines according to bit line architecture. For example, in case of the ABL architecture, the read/write circuit 140 has page buffers, each of which is connected to a corresponding bit line. In case of the odd-even bit line architecture, the read/write circuit 140 has page buffers, each of which is connected to a corresponding pair of bit lines (BLo, BLe). After program data has been loaded onto the read/write circuit 140, the procedure proceeds to operation S120.

In operation S120, channels of strings are pre-charged according to data to be programmed under a first word line bias condition. For example, if loaded data is data "1" indicating program inhibition of a memory cell, the string channel is pre-charged to (Vcc-Vth) under the first word line bias condition. Vcc may be a power supply voltage or a voltage greater than a ground voltage 0V and is provided to the strings through bit lines. Vth is a threshold voltage of the string selection transistor. On the other hand, if loaded data is data "0" indicating programming of a memory cell, the string channel is pre-charged to 0V under the first word line bias condition. Herein, the first word line bias condition is such a condition that word lines WL0~WL7 (shown in FIG. 4B) are biased to a ground voltage 0V. At this time, the string selection line SSL is biased to the power supply voltage Vcc.

After string channels are pre-charged under the first word line bias condition, the procedure proceeds to operation S140. In operation S140, the string channels are further pre-charged under a second word line bias condition that is different from the first word line bias condition. Like operation S120, bit lines are driven by 0V or Vcc according to loaded data. That is, during the second word line bias condition, bit lines continue to be driven by one of 0V and Vcc according to the value of data. Thus, operations S120 and S140 may constitute the two-step pre-charge period. Channel voltages of the memory strings may get relatively higher than that of a general one-step channel pre-charging step method according to the two-step pre-charge period, as described in detail later.

Next in operation S160, selected memory cells may be programmed or program inhibited by supplying a program voltage Vpgm to a selected word line and a pass voltage Vpass to unselected word lines. The selected and unselected word lines may be driven by a row decoder circuit 120 with the program and pass voltages from a voltage generator circuit 130 under the control of the control logic 160. For example, a selected memory cell (connected with a selected word line) in a string (or, an unselected/program-inhibited string) connected with a bit line (or, an unselected/program-inhibited bit line) driven by Vcc may be program inhibited. On the other hand, a selected memory cell (connected with a selected word line) in a string (or, a selected/program string) connected with a bit line (or, a selected/program bit line) driven by 0V may be programmed.

Then, in operation 180, whether selected memory cells are to be passed is determined. This may be done by data read from the selected memory cells. For example, the read/write circuit 140 reads data from the selected memory cells through the bit lines under the control of the control logic 160. A pass/fail judge circuit (not shown) in the control logic 160 determines if all of the read data from the selected memory cell is pass data or not. An example of the pass/fail judge circuit is disclosed in the U.S. Pat. No. 6,282,121, contents of which are incorporated by reference.

The pass/fail judge circuit may determine whether a program operation is passed or not, by a wired OR manner or a column scan manner. If the program operation passes, the procedure will be finished. If the program operation fails, the program operation will return back to the step 120 so that the steps S120 to S180 will be repeated until the programming operation passes. The number of times operations S120 to S180 are repeated may be limited to a predetermined number.

In another exemplary embodiment, operations 5120 to 5180 explained above may constitute a program loop. A program voltage to be supplied to the selected word line maybe altered, e.g., increased gradually, whenever the program loop is repeated.

Typically, bit lines are pre-charged with the power supply voltage if data is logic "1" so that memory cell is not programmed. As demand for lower power systems including nonvolatile memory devices increases, bit line pre-charge voltages decrease which makes it difficult to prevent program disturbance phenomenon.

Pre-charging a channel of a string may be accomplished by transferring electrons in the channel to a bit line coupled to the string. The pre-charge potential of the channel is determined by how many electrons are transferred to the bit line. The more electrons are transferred to the bit line, the higher the pre-charge potential of the channel. On the other hand, the fewer electrons transferred to the bit line, the lower the pre-charge potential of the channel.

If the potential of the channel becomes too low, the memory cell that is prohibited from being programmed may be affected by the program disturbance phenomenon due to decrease in a voltage difference between the program voltage Vpgm and the channel potential. The pre-charge potential of the channel depends on a bit line voltage, which is often the same voltage as the power supply voltage. As demand for lower power consuming devices increases, the power supply voltage has been decreasing. Thus, a bit line voltage may also be lowered in accordance with the power supply voltage and/or a channel pre-charge voltage has to become high due to the program disturbance. In this case, the ability to increase a channel pre-charge potential by driving a bit line with a power supply voltage is difficult/limited.

In contrast, according to a program method of embodiments, as explained above, the two-step pre-charging method that controls word line bias conditions allows the channel pre-charge potential to be readily increased.

A program method of the flash memory device in accordance with an example embodiment may adopt selectively one of the one-step pre-charge method and the two-step pre-charge method by various methods, such as a mode register set operation or a detecting operation of the power supply voltage. For example, when one-step pre-charge method is selected, pre-charging (for example, operation S140 in FIG. 3) a channel under the second word line bias condition is omitted. When the two-step pre-charge method is selected, pre-charging (for example, operation S140 in FIG. 3) a channel under the second word line bias condition follows pre-charging (for example, operation S120 in FIG. 3) a channel under the first word line bias condition.

An external device (e.g., a memory controller) may select one of the one-step pre-charge method and the two-step pre-charge method by the mode register set operation. Alternatively, the external device detects the program disturbance phenomenon after the program operation of the flash memory device is ended. That is, because the program disturbance phenomenon is dependent on data pattern to be programmed, the degree to which the program disturbance phenomenon may occur may be determined. According to the determined degree of occurrence of the program disturbance phenomenon, a channel pre-charge method may be selected. So, the flash memory device may be constructed to operate the program operation according to both the one-step and two-step pre-charge methods.

Hereinafter, various exemplary embodiments of the second word line bias condition for the two-step pre-charge method will be explained.

Figure 4A:
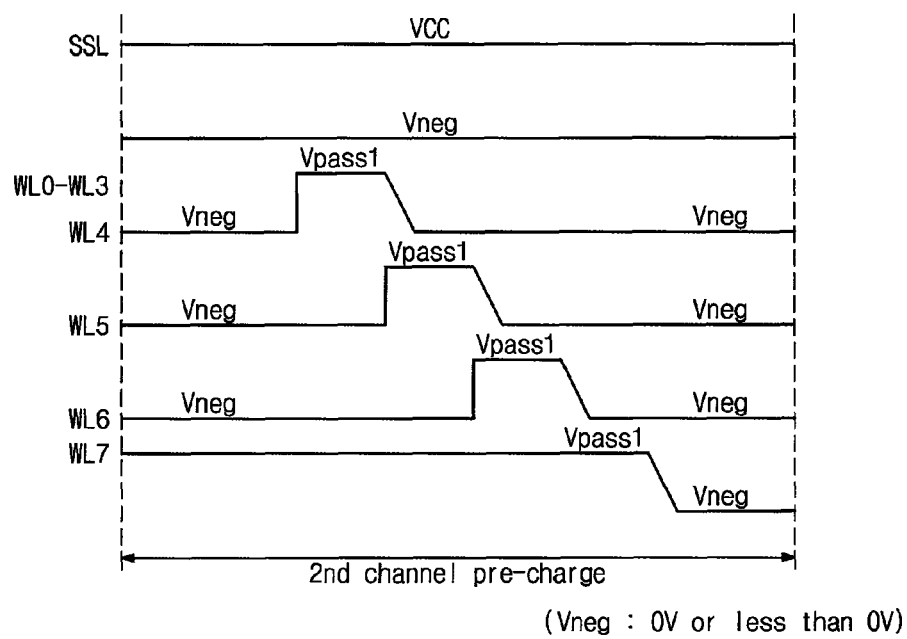
FIG. 4A illustrates a timing diagram a second word line bias condition according to a first example embodiment.
Figure 4B:
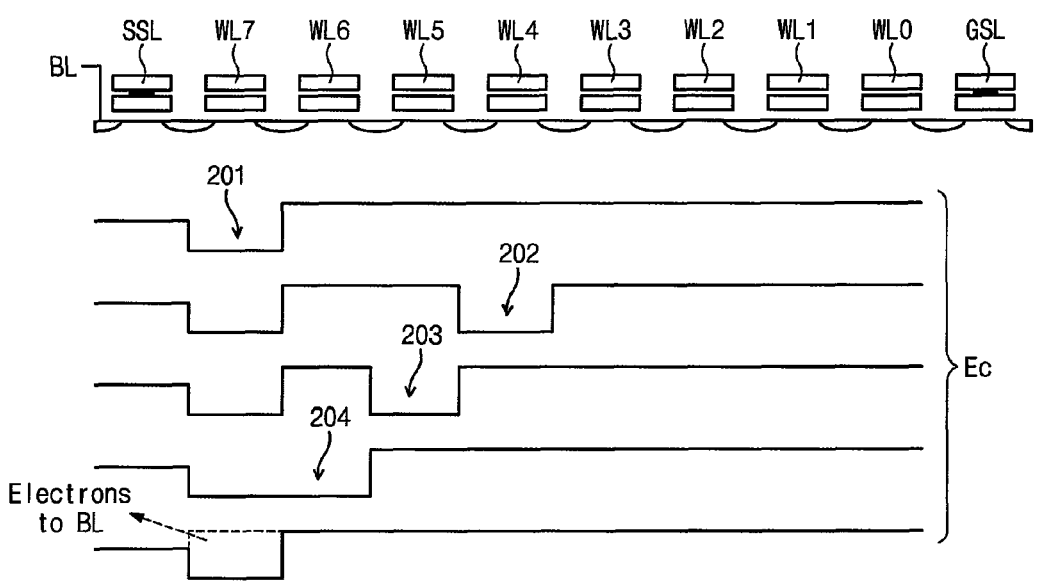
FIG. 4B illustrates channel potential in a string structure being changed during the channel pre-charge operation under the second word line bias condition according to the first example embodiment.

FIG. 4A illustrates a second word line bias condition according to a first example embodiment. FIG. 4B illustrates channel potential in a cell string that is changed during a channel pre-charge operation under the second word line bias condition according to the first example embodiment. For convenience of explanation, the cell string includes eight memory cells connected in series.

After channels are pre-charged under the first word line bias condition, e.g., in which all word lines are biased to a ground voltage, channels are pre-charged under the second bias word line condition. As shown in FIG. 4A, in the second word line bias condition, the string selection line SSL is biased to the power supply voltage VCC. Also in the second word line bias condition, initially, word lines WL0~WL6 are biased to the first word line voltage Vneg, and a word line WL7 next to the string selection transistor (or outer-most word line toward the bit line) is biased to a second word line voltage Vpass1. The first word line voltage Vneg may be 0V or a negative voltage. The second word line voltage Vpass1 may be smaller than a pass voltage Vpass that is biased to the unselected word lines during a program operation. According to the second word line bias condition, as conduction band, i.e., channel potential, corresponding to the word line WL7 decreases, as shown in FIG. 4B, a potential well 201 is formed at a channel of a memory cell corresponding to the word line WL7.

Then, the word line WL4 gets biased to the second word line voltage Vpass1 and conduction band, i.e., channel potential, corresponding to the word line WL4 gets lowered. As a result, a potential well 202 is formed at the channel of memory cell corresponding to the word line WL4. After then, the word line WL4 is re-biased to Vneg and the word line WL5 gets biased to the second word line voltage Vpass1. As the word line WL5 gets biased to the second word line voltage Vpass1, conduction band i.e., channel potential, corresponding to the word line WL5, decreases and a potential well 203 is formed at the channel of memory cell corresponding to the word line WL5. At this time, electrons in the potential well 202 move to the potential well 203.

Then, the word line WL5 returns to the first word line voltage Vneg and the word line WL6 is biased to the second word line voltage Vpass1. As the WL6 increases to the second word line voltage Vpass1, a conduction band i.e., channel potential, corresponding to the word line WL6 decreases and a potential well 204 is formed in the channel of memory cell corresponding to the word line WL6. At this time, electrons in the potential well 203 move to the potential well 204.

As a voltage of the word line WL6 decreases from the second word line voltage Vpass1 to the first word line voltage Vneg, electrons transferred through the potential wells 202, 203, and 204 move into the potential well 201. Thus, electrons are gathered into the potential well 201 by sequential voltage variation of the word lines WL4~WL6.

Finally, a voltage of the word line WL7 decreases from the second word line voltage Vpass1 to the first word line voltage Vneg, the potential well 201 increase, as shown by a dashed line. As a result, electrons gathered in the potential well 201 move to the bit line BL. As electrons move to the bit line BL, the channel potential becomes higher than the channel potential acquired during operation S120, i.e., the first channel pre-charge operation occurred.

Additional electrons, which exist in the channel after the first pre-charge operation (corresponding to operation S120 in FIG. 3), may be moved to the bit line BL by sequentially changing voltages of the word lines WL4~WL7. The gradual voltage variation of the word lines WL4~WL7 may include one pre-charge cycle. Repetition of the pre-charge cycle increases the pre-charge potential of the channel. Though there is in FIG. 4A illustrated one example that one pre-charge cycle is executed, two or more pre-charge cycles may be repeatedly executed in the second pre-charge operation corresponding to operation S140 in FIG. 3, as needed. In FIG. 4B, the example that electrons are gathered into the potential well 201 during the pre-charge cycle is illustrated.

In the first exemplary embodiment, four word lines, i.e., WL4 to WL7, had their respective word line voltages changed. However, it will be understood that voltages of all word lines WL0~WL7 may be changed during the second pre-charge operation. Accordingly, additional electrons may be moved to the bit line BL by controlling voltages of all or some of the word lines WL0~WL7.

Figure 5A:
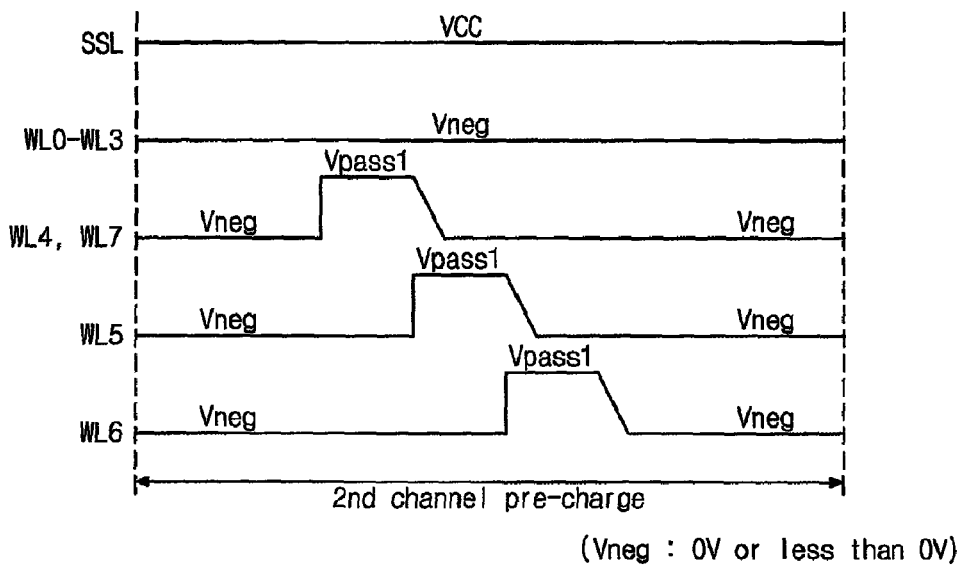
FIG. 5A illustrates a timing diagram of a second word line bias condition according to a second example embodiment.
Figure 5B:
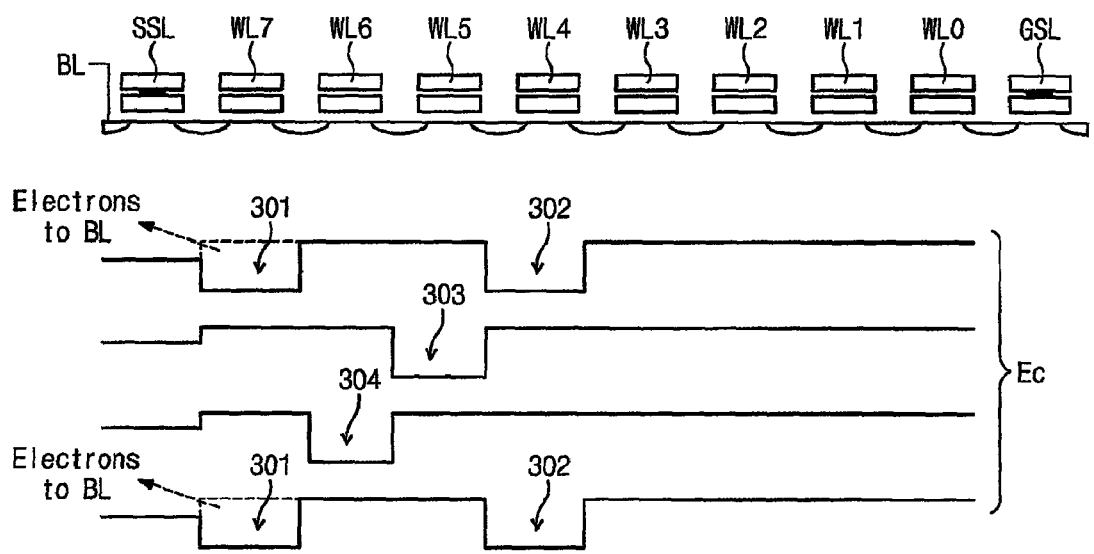
FIG. 5B illustrates channel potential of a string structure being changed during the channel pre-charge operation under the second word line bias condition according to the second example embodiment.

FIG. 5A illustrates a second word line bias condition according to a second example embodiment. FIG. 5B illustrates channel potentials of a cell string to be changed during a channel pre-charge operation under the second word line bias condition according to the second example embodiment. The channel pre-charge operation shown in FIGS. 5A and 5B is substantially the same as that in FIGS. 4A and 4B, so only differences will be explained below.

As shown in FIG. 5A, word lines WL4 and WL7 are biased with same voltage wave. That is to say, as the word lines WL4 and WL7 are set to the second word line voltage Vpass1 at the same time, each conduction band, i.e., channel potential, corresponding to respective word lines WL4 and WL7, decreases. As the result, potential wells 301 and 302 are formed. After then, when the word line WL7 returns to the first word line voltage Vneg, the potential well 301 changes as indicated by a dashed line, indicating that electrons move to the bit line BL. After then, as explained in FIG. 4A, voltages of word lines WL5 and WL6 are changed sequentially, as shown in FIG. 5A. Electrons of the channel move to the bit line BL through the potential wells formed by sequentially changing voltages of the word lines WL4 to WL7.

In the second exemplary embodiment, the sequential voltage variation of the word lines WL4 to WL7 constitutes one pre-charge cycle. Repetition of the pre-charge cycle may result in increasing a pre-charge potential of the channel. Though one pre-charge cycle is executed in FIG. 5A, if necessary, two or more pre-charge cycles may be repeatedly executed in the second pre-charge operation that corresponds to the operation S140 in FIG. 3.

In the second exemplary embodiment, four word lines, i.e., WL4 to WL7, had their respective word line voltages changed. However, it will be understood that voltages of all word lines WL0~WL7 may be changed during the second pre-charge operation. Accordingly, additional electrons may be moved to the bit line BL by controlling voltages of all or some of the word lines WL0~WL7.

Figure 6:
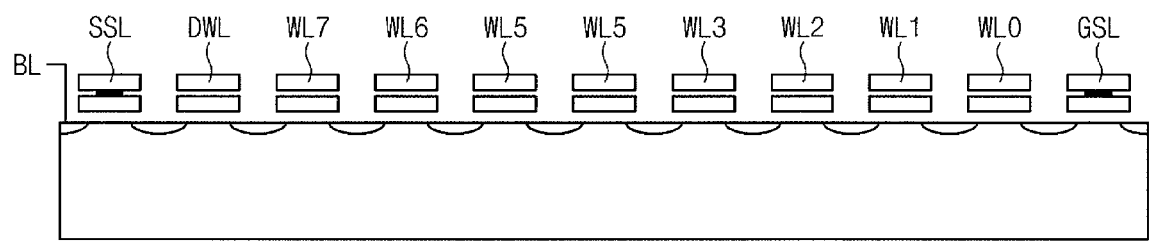
FIG. 6 illustrates a string structure including a dummy word line between a string selection line SSL and external-most word line WL7.

FIG. 6 illustrates a cell string structure including a dummy word line between a string selection line SSL and an outer-most word line WL7. Referring to FIG. 6, the cell string structure has a dummy memory cell coupled to a dummy word line DWL between the string selection transistor and a memory cell coupled to the outer-most word line WL7. A dummy memory cell also may be disposed between the ground selection transistor and a memory cell coupled to WL0.

Figure 7A:
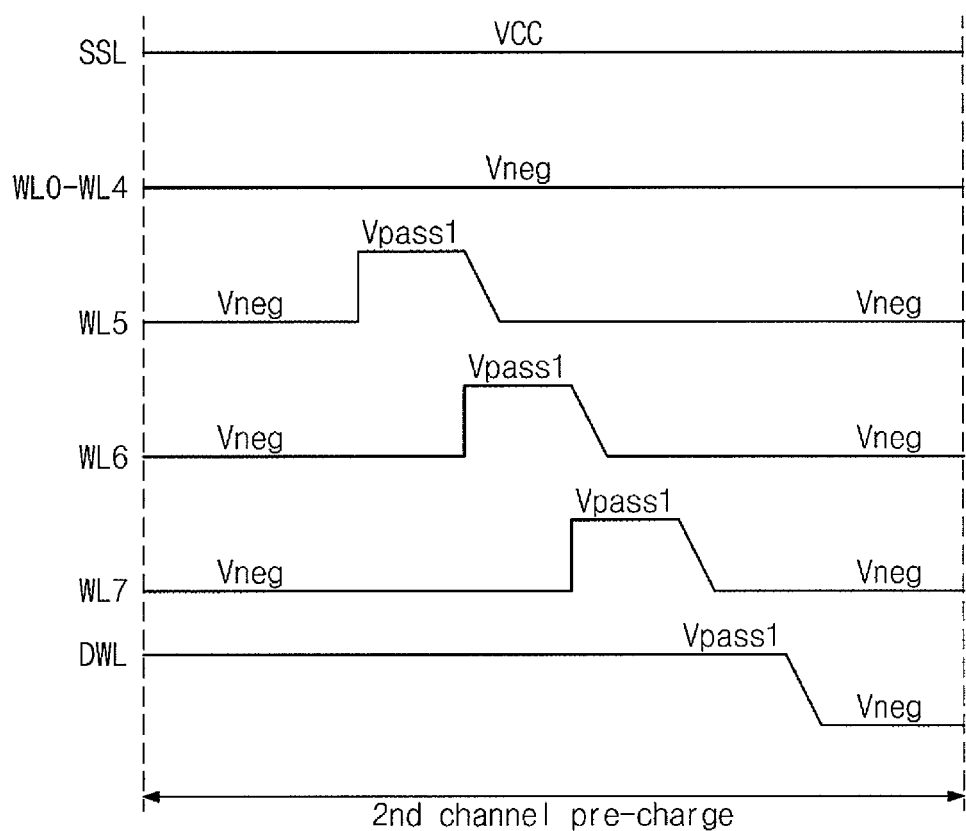
FIG. 7A illustrates a timing diagram of a second word line bias condition applicable to the string structure of FIG. 6, according to a third example embodiment.
Figure 7B:
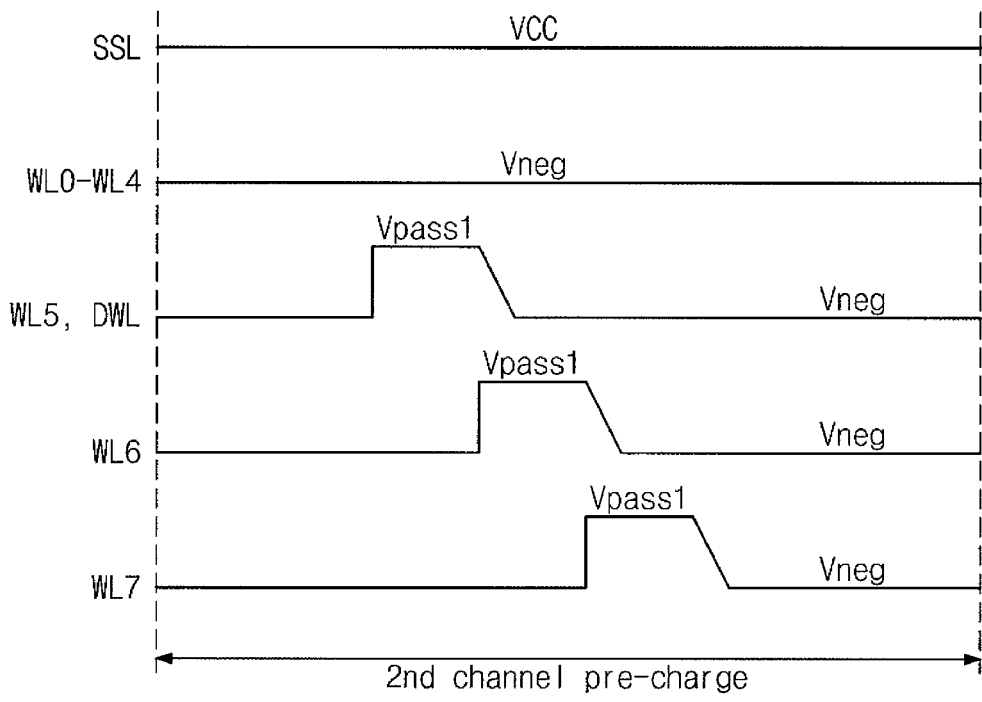
FIG. 7B illustrates a timing diagram of a second word line bias condition applicable to the string structure of FIG. 6, according to a fourth example embodiment.

FIG. 7A illustrates a second word line bias condition applicable to the cell string structure of FIG. 6, according to third example embodiment. FIG. 7B illustrates a second word line bias condition applicable to the cell string structure of FIG. 6, according to fourth example embodiment.

Referring to FIG. 6, FIG. 7A, and FIG. 7B, a bias condition of the dummy word line may be set to equal that of the outer-most word line WL7 illustrated in FIGS. 4A and 5A. For this, the bias condition of the word lines WL5 to WL7 may be changed to equal that of the word lines WL4 to WL6 in FIGS. 4A and 5A. In FIGS. 7A and 7B, the word line WL4 is biased as WL0 to WL3 are in FIGS. 4A and 5A. That is, though the dummy word line DWL is provided between the SSL and the WL7, the two-step pre-charge method explained in previous embodiments may be applied in the same manner.

Figure 8A:
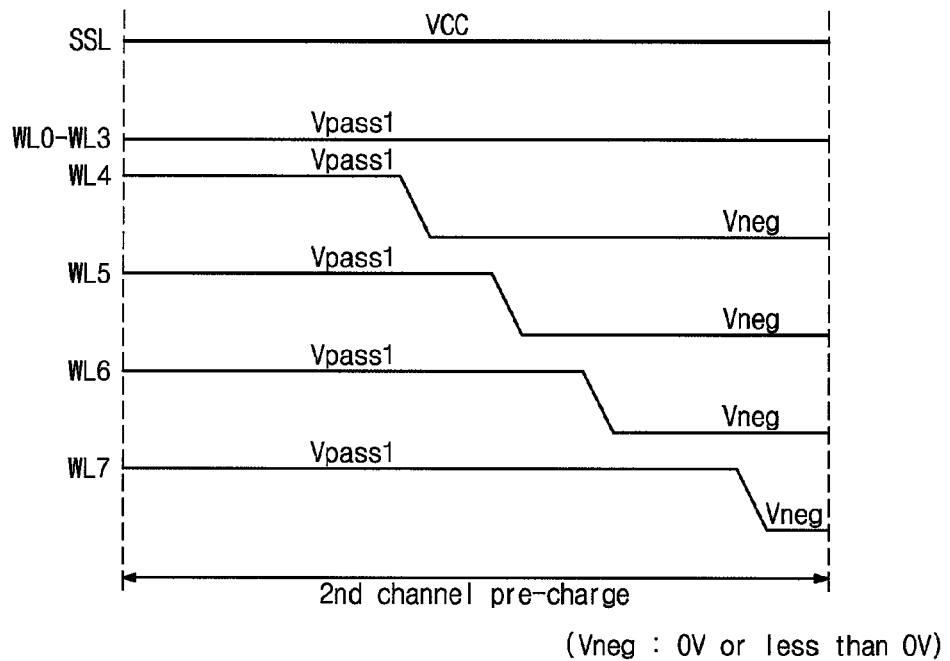
FIG. 8A illustrates a timing diagram of a second word line bias condition according to a fifth example embodiment.
Figure 8B:
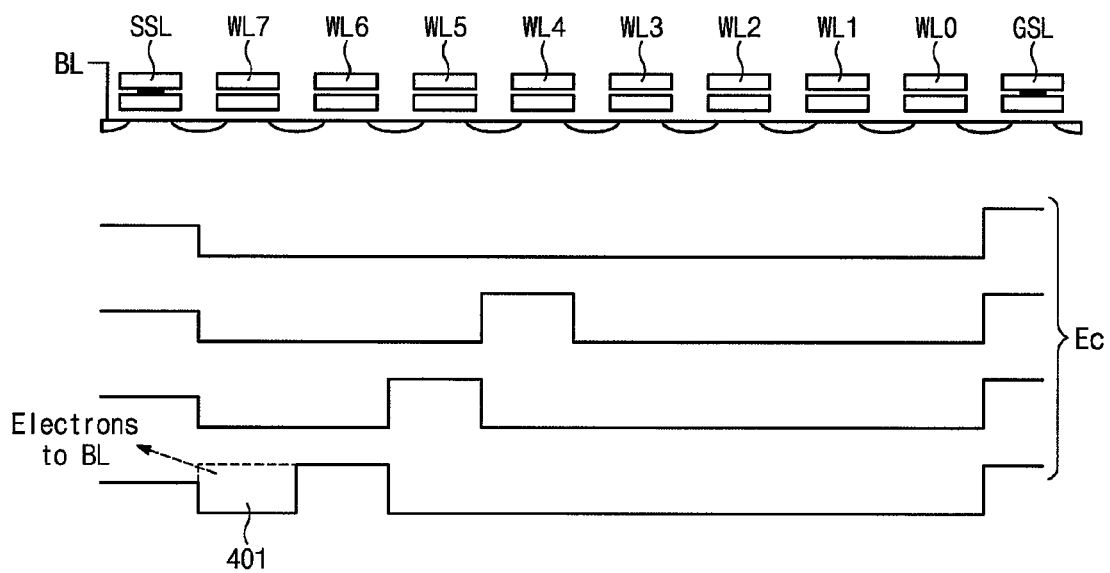
FIG. 8B illustrates channel potential in a string structure being changed during the channel pre-charge operation under the second word line bias condition according to the fifth example of the inventive concept.

FIG. 8A illustrates a second word line bias condition according to fifth example embodiment. FIG. 8B illustrates channel potentials in a cell string structure being changed during the channel pre-charge operation under the second word line bias condition according to the fifth example embodiment.

After pre-charging channels associated with all word lines WL0~WL7 according to the first word line bias condition, the channels are pre-charged according to the second word line bias condition. Under the second word line bias condition, as shown in FIG. 8A, the SSL is biased by the power supply voltage VCC and all word lines WL0~WL7 are biased by the second word line voltage Vpass1. By this bias condition, the conduction band of a channel of a string (i.e., a channel potential) decreases. That is, as shown in FIG. 8B, a potential well 401 is formed along the channel of the string.

Then, as shown in FIG. 8A, voltages of word lines WL4~WL6 decrease from the second word line voltage Vpass1 to the first word line voltage Vneg sequentially, so that electrons are gathered into the potential well 401 formed at the channel of the memory cell corresponding to the word line WL7. Finally, a voltage of the word line WL7 decreases form the second word line voltage Vpass1 to the first word line voltage Vneg. Thus, the potential well 401 is changed, as indicated by a dashed line. As a result, the electrons in the potential well 401 move to the bit line BL. As the electrons move to the bit line BL, the channel potential becomes higher than the pre-charged channel potential realized from the first channel pre-charge operation of operation S120 in FIG. 3.

In this exemplary embodiment, the gradual voltage variation of the word lines WL4 to WL7 constitutes one pre-charge cycle. Repetition of the pre-charge cycle increases a pre-charge potential of the channel. Though in FIG. 8A one pre-charge cycle is executed, if necessary, two or more pre-charge cycles may be repeatedly executed in the second pre-charge operation of operation S140 in FIG. 3.

In the fifth exemplary embodiment, four word lines, i.e., WL4 to WL7, had their respective word line voltages changed. However, it will be understood that voltages of all word lines WL0~WL7 may be changed during the second pre-charge operation. Accordingly, additional electrons may be moved to the bit line BL by controlling voltages of all or some of the word lines WL0~WL7.

Figure 9A:
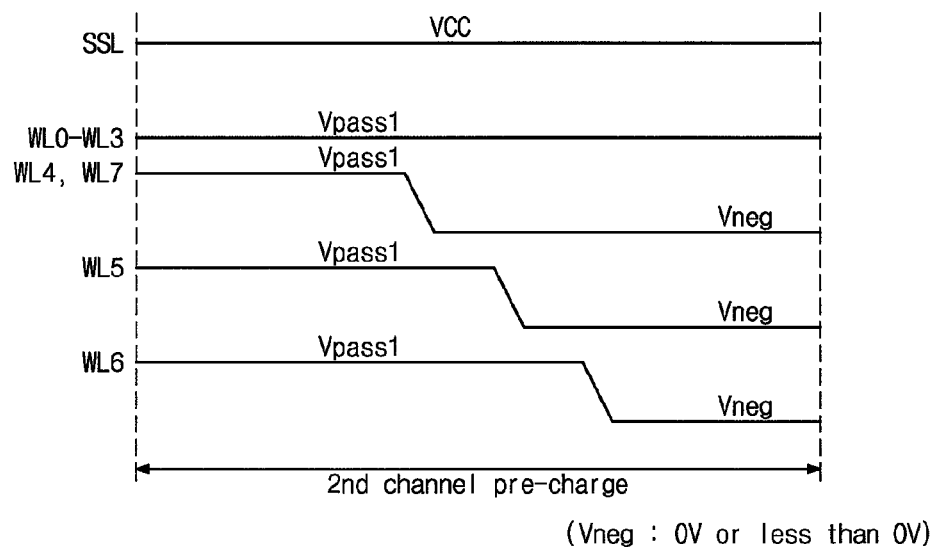
FIG. 9A illustrates a timing diagram of a second word line bias condition according to a sixth example embodiment.
Figure 9B:
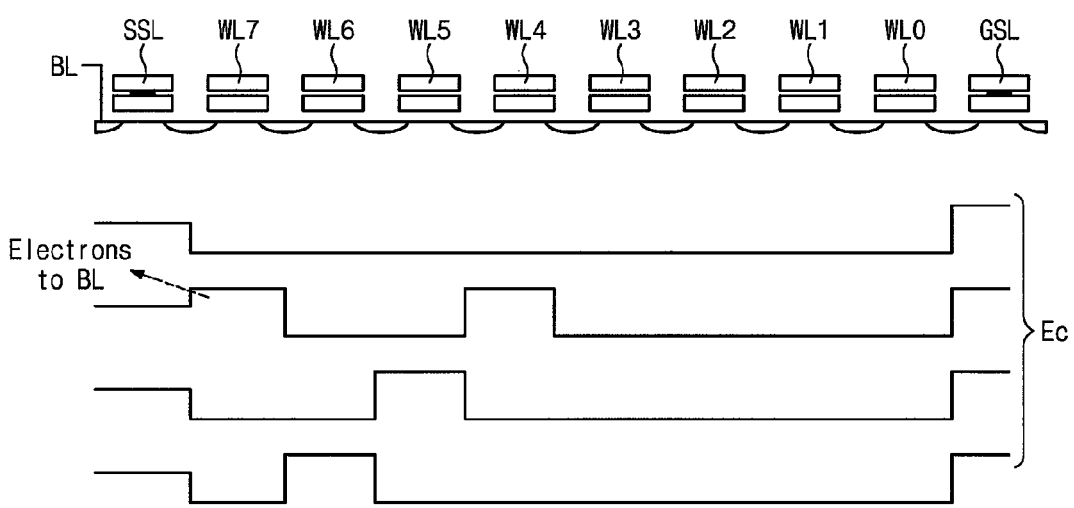
FIG. 9B illustrates channel potential in a string structure being changed during the channel pre-charge operation under the second word line bias condition according to the sixth example embodiment.

FIG. 9A illustrates a second word line bias condition according to sixth example embodiment. FIG. 9B illustrates channel potential in a cell string structure being changed during the channel pre-charge operation under the second word line bias condition according to the sixth example embodiment. The channel pre-charge operation shown in FIGS. 9A and 9B is substantially the same as shown in FIGS. 4A and 4B, so only differences that will be explained below.

As shown in FIG. 9A, word lines WL4 and WL7 are biased with the same voltage wave. That is to say, referring to FIG. 9A and FIG. 9B, the word lines WL4 and WL7 are set to Vneg at the same time, conduction bands of the channel, i.e., channel potential, of the memory cells corresponding to WL4 and WL7 increases. When the voltages of the word lines WL4, WL7 decreases from the second word line voltage Vpass1 to the first word lines voltage Vneg, electrons in the channel move to the bit line BL. Then, voltages of word lines WL5 and WL6 sequentially decrease from the second word line voltage Vpass1 to the first word lines voltage Vneg, as described in FIG. 8A. Thus, electrons move to the bit line BL by sequentially changing voltages of the word lines WL4 to WL7.

In case of FIGS. 8A and 9A, at least one dummy word line DWL may be provided between the WL7 and the SSL, as explained with reference to FIG. 6. A bias condition for the dummy word line may be set to equal a bias condition for the outer-most word line WL7 described in FIGS. 8A and 9A. During the pre-charge cycle, the bias condition for the word lines WL5~WL7 may be changed the same as that of the word lines WL4~WL6, but a word line WL4 may be biased the same as word lines WL0~WL3. Though the dummy word line is provided between the SSL and the WL7 in FIG. 6, the above-described two-step channel pre-charge method can be applicable to a flash memory device in the same way. Though not shown in FIG. 6, another dummy word line may be provided between the GSL and the WL0.

In the sixth exemplary embodiment, four word lines, i.e., WL4 to WL7, had their respective word line voltages changed. However, it will be understood that voltages of all word lines WL0~WL7 may be changed during the second pre-charge operation. Accordingly, additional electrons may be moved to the bit line BL by controlling voltages of all or some of the word lines WL0~WL7.

Figure 10A:
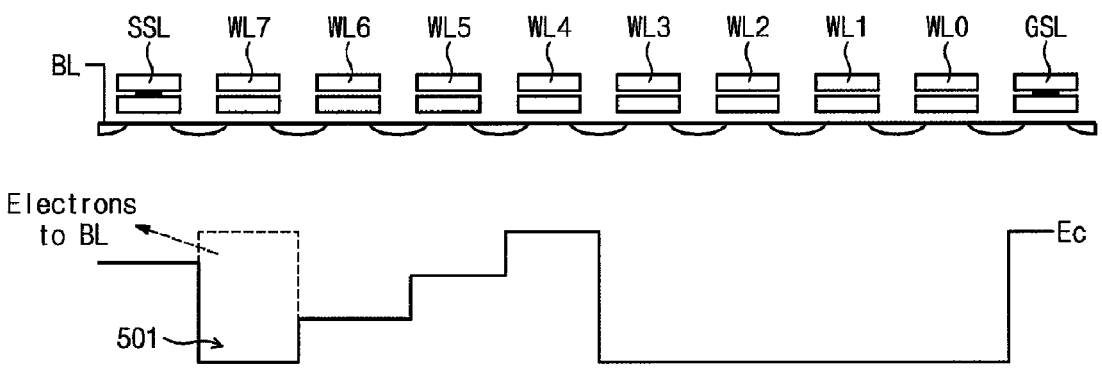
FIG. 10A illustrates channel potential in a string structure being changed during the channel pre-charge operation under a second word line bias condition according to a seventh example embodiment.
Figure 10B:
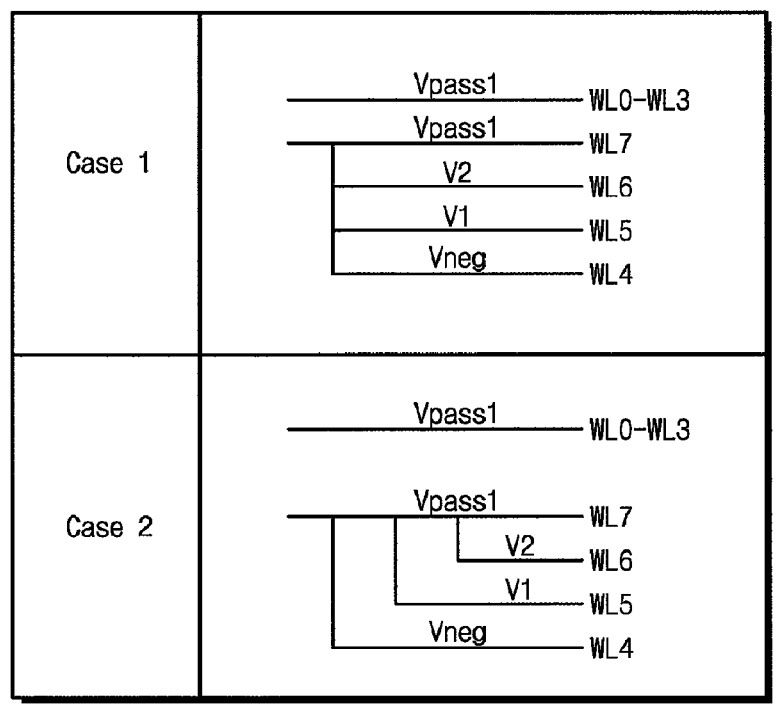
FIG. 10B illustrates the second word line bias conditions for realizing the channel potential illustrated in FIG. 10A.

FIG. 10A illustrates channel potential in a cell string structure being changed during the channel pre-charge operation under a second word line bias condition according to the seventh example embodiment. FIG. 10B illustrates the second word line bias conditions for realizing the channel potential illustrated in FIG. 10A.

As shown in FIG. 10A, channel potential (i.e., conduction band) corresponding to each of word lines WL4~WL7 decreases stepwise, so that electrons are gathered into a potential well 501 formed at channel of the memory cell corresponding to the word line WL7. Then, as shown in FIG. 10A, the potential well 501 is changed as indicated by a dashed line by decreasing the voltage of the word line WL7 from the second word line voltage Vpass1 to the first word line voltage Vneg. As a result, electrons in the potential well 501 move to the bit line BL. As the electrons move to the bit line BL, the channel potential becomes higher than pre-charged channel potential realized after the first channel pre-charge operation is executed in operation S120 in FIG. 3.

The channel potential shown in FIG. 10A can be formed after all word lines WL0~WL7 are set to Vpass1 and then each of WL4~WL6 is set to have a corresponding voltage simultaneously or sequentially. For example, referring to case 1 of FIG. 10B, first, all word lines WL0~WL7 are set to the Vpass1 and then WL4 is set to Vneg, WL5 and WL6 are set to V1 and V2, respectively, which are different than Vneg and between Vneg and Vpass1. WL4~WL7 are set to corresponding voltages at the same time. For another example, referring to case 2 of FIG. 10B, first, all word lines WL0~WL7 are set to Vpass1, and then WL4 is set to Vneg. After a certain time, WL5 and WL6 are respectively and sequentially set to V1 and V2, with a certain time. That is, WL4~WL7 are set to corresponding voltages sequentially.

According to the bias condition illustrated in FIG. 10B, electrons of the channel are gathered in the potential well 501, which are removed to the bit line when the voltage of WL7 is changed to Vneg. That is, at the time the voltage of the WL7 is changed to the Vneg, the potential well 501 is changed as drawn in dash-line in FIG. 10A, which makes the electrons of the channel removed to the bit line. As the electrons are removed to the bit line, the channel potential becomes higher than the pre-charged channel potential that is acquired during the first channel pre-charge operation corresponding to the step S120 in FIG. 3.

Figure 11A:
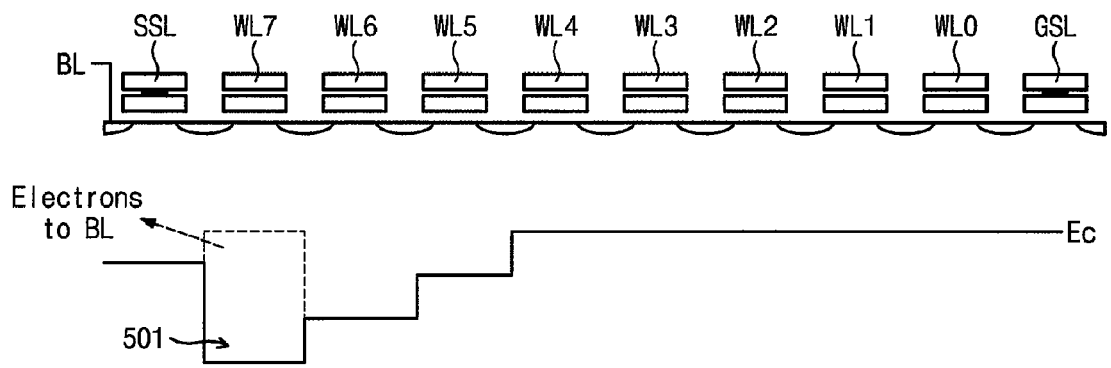
FIG. 11A illustrates channel potential in a string structure being changed during the channel pre-charge operation under a second word line bias condition according to an eighth example of embodiment.
Figure 11B:
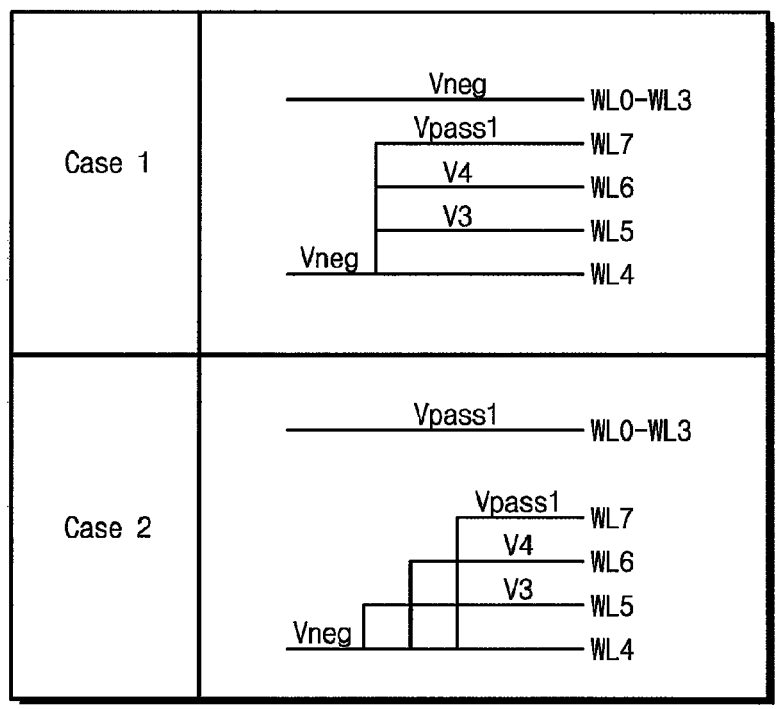
FIG. 11B illustrates the second word line bias conditions for realizing the channel potential illustrated in FIG. 11A.

FIG. 11A illustrates channel potential in a cell string structure being changed during the channel pre-charge operation under a second word line bias condition according to the eighth example embodiment. FIG. 11B illustrates the second word line bias conditions for the channel potential illustrated in FIG. 11B.

A channel pre-charge method illustrated in FIG. 11A is the same as that of explained in FIG. 10A, except that all word lines WL0~WL7 are set to the first word line voltage Vneg rather than the second word line voltage Vpass1 during an initial period of the second channel pre-charge operation. FIG. 10A and FIG. 11A, may also include at least one dummy word line between the SSL and the WL7, as explained above with reference to FIG. 6. When the dummy word line is present, a bias condition of the dummy word line is the same as a bias condition of the WL7 explained in FIG. 10A and FIG. 11B.

In these exemplary embodiments, four word lines, i.e., WL4 to WL7, had their respective word line voltages changed. However, it will be understood that voltages of all word lines WL0~WL7 may be changed during the second pre-charge operation. Accordingly, additional electrons may be moved to the bit line BL by controlling voltages of all or some of the word lines WL0~WL7.

Figure 12A:
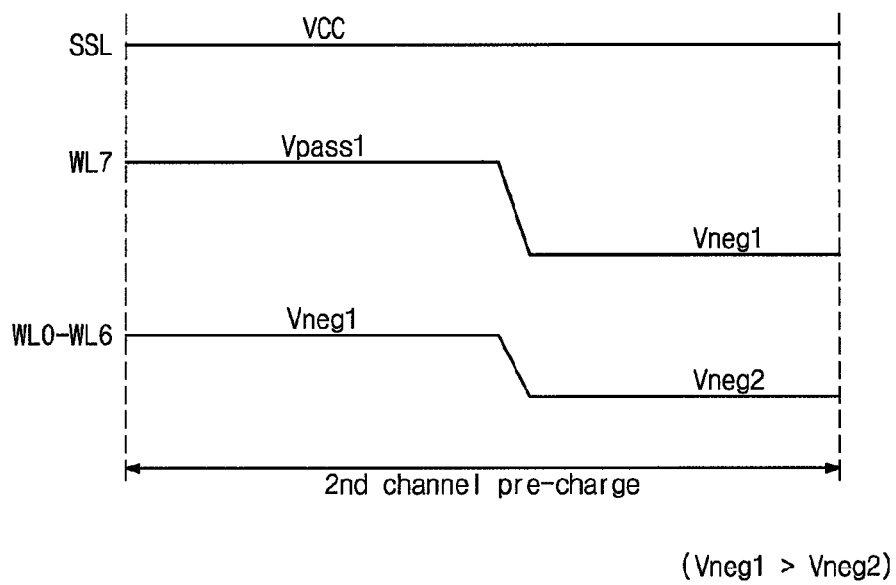
FIG. 12A illustrates a timing diagram of a second word line bias condition according to a ninth example embodiment.
Figure 12B:
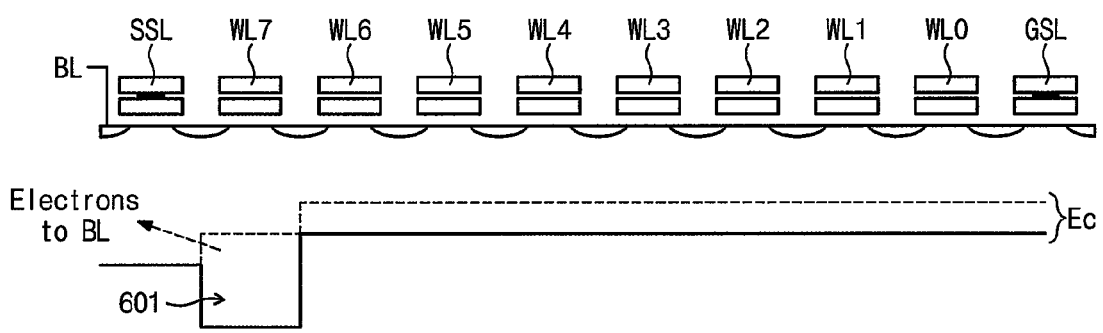
FIG. 12B illustrates channel potential in a string structure being changed during the channel pre-charge operation under the second word line bias condition according to the ninth example embodiment.

FIG. 12A illustrates a second word line bias condition according to ninth example embodiment. FIG. 12B illustrates channel potential in a cell string structure being changed during the channel pre-charge operation under the second word line bias condition according to the ninth example embodiment.

After pre-charging the channels associated with all word lines WL0~WL7 according to the first word line bias condition, the channels are pre-charged according to the second word line bias condition. Under the second word line bias condition, as shown in FIG. 12A, the SSL is biased by the power supply voltage VCC, a word line WL7 is set to the second word line voltage Vpass1, and word lines WL0~WL6 are set to the first word line voltage Vneg1. By this bias condition, as shown in FIG. 12B, a potential well 601 is formed at a channel of the memory cell corresponding to the WL7. Then, as shown in FIG. 12A, the voltage of the WL7 decreases from the second word line voltage Vpass1 to the first word line voltage Vneg1 and voltages of the remaining word lines WL0~WL6 decrease from the first word line voltage Vneg1 to a third word line voltage Vneg2. According to this bias condition, the conduction band of the channel is changed as indicated by a dashed line in FIG. 12B, so that the electrons in the potential well 601 move to the bit line BL. As the electrons move to the bit line BL, the channel potential becomes higher than the pre-charged channel potential realized after the first channel pre-charge operation of operation S120 in FIG. 3.

Example embodiments illustrate that electrons move from a channel to a bit line through the string selection transistor. However, the embodiments may be employed to move electrons from a channel to the common source line CLS through the common source transistor GSL.

Figure 13:
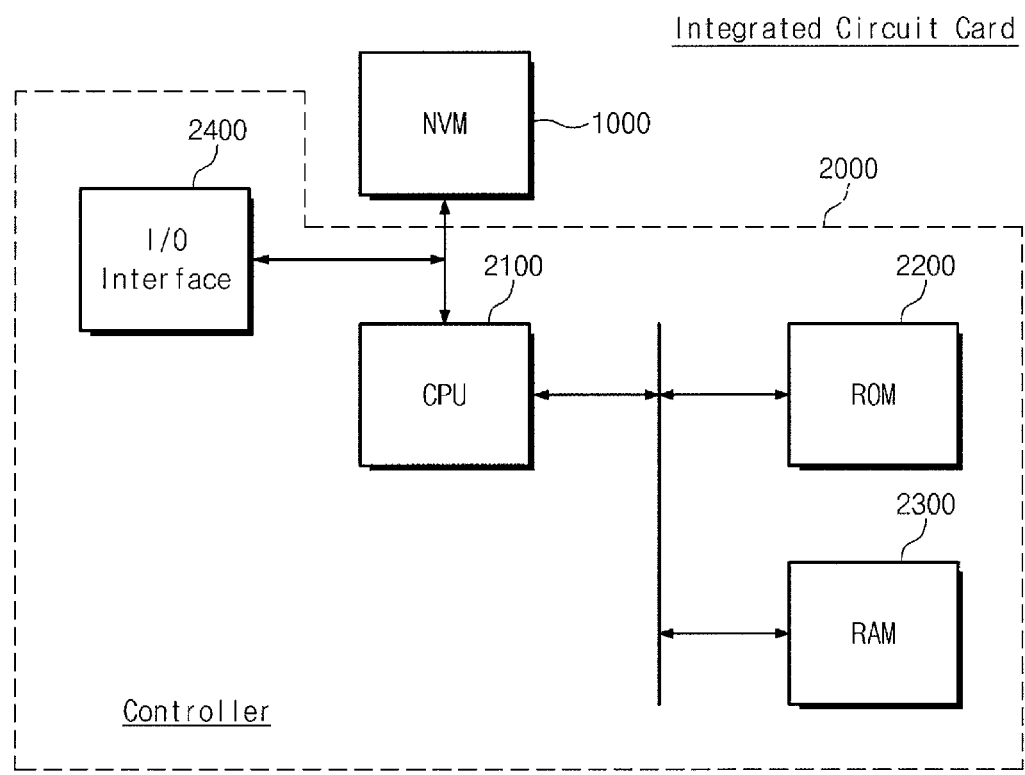
FIG. 13 illustrates an integrated circuit IC card including the flash memory device according to one example embodiment.

FIG. 13 illustrates an integrated circuit card IC card including flash memory device according to an example embodiment. Referring to FIG. 13, the IC card (e.g., a smart card) includes a flash memory device 1000 and a controller 2000. The NVM 1000 is substantially the same as illustrated in FIG. 1, detail explanation of which is omitted. The controller 2000 controlling the NVM 100 includes a CPU 2100, a ROM 2200, a RAM 2300 and an I/O interface 2400. The CPU 2100 controls an overall operation of the IC card using various programs stored in the ROM 2200. The I/O interface 2400 provides an interface for an external device. The flash memory device 1000 may be replaced by other types of nonvolatile memory devices, e.g., PRAM, MRAM, etc, to which the two-step channel pre-charge method according to embodiments is applicable.

Figure 14:
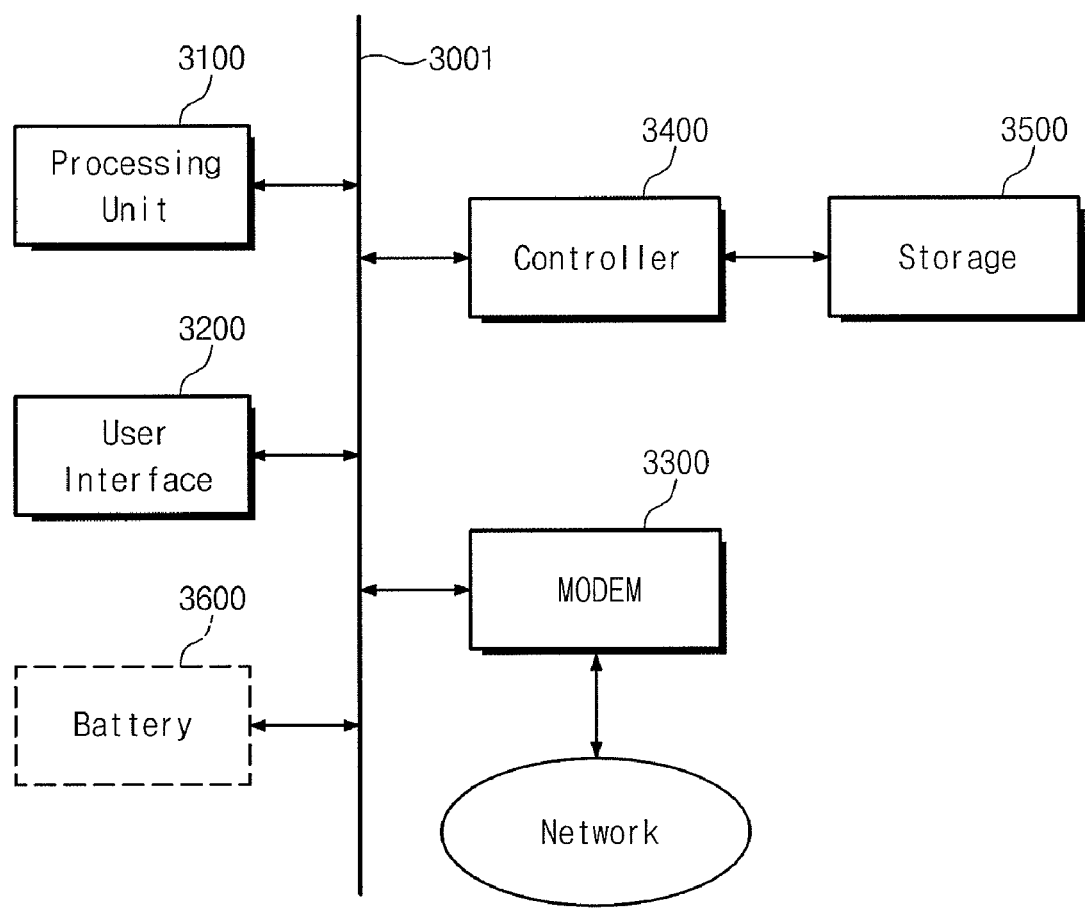
FIG. 14 illustrates a block diagram of a computing system including the flash memory device in accordance with one example embodiment.

FIG. 14 illustrates block diagram of a computing system including flash memory device in accordance with an example embodiment. Referring to FIG. 14, the computing system includes a processing unit 3100, a user interface 3200, a modem 3300, a controller 3400, which are connected to a system bus 3001, and a storage medium 3500 including a nonvolatile memory device. The nonvolatile memory device has substantially the same construction as shown in FIG. 1 and may adopt a two-step channel pre-charge method according to the embodiments. N-bit data that are processed or to be processed by the processing unit 3100 is stored in the storage medium 3500 having the nonvolatile memory device. If the computing system is a mobile device, a battery 3600 for providing an operating voltage for the computing system may be included in the computing system. Though not shown in FIG. 14, it will understood that the computing system may further include an application chipset, a camera image processor CIS, a mobile DRAM or the like. In exemplary embodiments, the controller 3400 and the storage medium 3500 are implemented as an SSD (Solid State Drive) or a memory card, etc.

The nonvolatile memory device 3500 and/or the controller 3400 may be packaged in various ways, e.g., Package on Package (PoP), Ball Grid Array (BGA), Chip Scale Package (CSPs), Plastic Leaded Chip Carrier (PLCC), Plastic Dual In-Line Package (PDIP), Die in Waffle Pack, Die in Wafer Form, Chip on Board (COB), Ceramic Dual In-Line Package (CERDIP), Plastic Metric Quad Flat Pack (MQFP), Thin Quad Flat Package (TQFP), Small Outline IC (SOIC), Shrink Small Outline Package (SSOP), Thin Small Outline Package (TSOP), Thin Quad Flat Package (TQFP), System In Package (SIP), Multi Chip Package (MCP), Wafer-level Fabricated Package (WFP), Wafer-level Processed Stack Package (WSP), and so forth.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A channel pre-charge method of a nonvolatile memory device including a cell string, comprising:
    pre-charging a channel of the cell string according to a first word line bias condition; and
    pre-charging the channel of the cell string according to a second word line bias condition different than the first word line bias condition.

2. The channel pre-charge method as claimed in claim 1, wherein the cell string comprises:
    a string selection transistor connected to a bit line, a plurality of memory cells, each of which is connected to a corresponding word line; and
    a ground selection transistor connected to a common source line, wherein the plurality of memory cells is connected in series between the string selection transistor and the ground selection transistor.

3. The channel pre-charge method as claimed in claim 2, wherein, during the first word line bias condition, all word lines are biased to a ground voltage.

4. The channel pre-charge method as claimed in claim 3, wherein, during the first word line bias condition, the bit line is biased to one of a power supply voltage and the ground voltage according to data to be programmed, and the string selection transistor is biased to the power supply voltage.

5. The channel pre-charge method as claimed in claim 4, wherein electrons in the channel of the cell string pre-charged during the first word line bias condition move to the bit line during the second word line bias condition.

6. The channel pre-charge method as claimed in claim 5, wherein the second word line bias condition forms a potential well at a channel of a memory cell corresponding to an outer-most word line towards the bit line and moves additional electrons in the potential well to the bit line.

7. The channel pre-charge method as claimed in claim 6, wherein the outer-most word line is a dummy word line.

8. The channel pre-charge method as claimed in claim 2, wherein the second word line bias condition forms a potential well sequentially or stepwise at each channel of the plurality of memory cells corresponding to all or some of the word lines and moves electrons in the potential well of a memory cell corresponding to an outer-most word line toward the bit line.

9. The channel pre-charge method as claimed in claim 2, wherein pre-charging the channel of the cell string according to the second word line bias condition is executed once or repeated.

10. A program method of a nonvolatile memory device including a plurality of cell strings, each of which is connected to a bit line and includes a plurality of memory cells connected in series to a corresponding bit line through a selection transistor, each of which is connected to a corresponding word line, the method comprising:
    moving electrons from channels of the cell strings to the corresponding bit lines according to data to be programmed under a first word line bias condition;
    moving additional electrons to the corresponding bit lines under a second word line bias condition that is different than the first word line bias condition and in which voltages of all or some of the word lines are controlled; and
    supplying a program voltage and a pass voltage to selected word lines and non-selected word lines, respectively.

11. The program method as claimed in claim 10, wherein the word lines all are biased to a ground voltage under the first word line bias condition.

12. The program method as claimed in claim 11, wherein each of the bit lines is biased by one of a power supply voltage and the ground voltage according to data to be programmed and the string selection transistor is biased by the power supply voltage.

13. The program method as claimed in claim 10, wherein the second word line bias condition forms a potential well sequentially at each of channels of the plurality of memory cells corresponding to all or some of the word lines and moves electrons in the potential well of a memory cell corresponding to an outer-most word line towards a bit line to the bit line.

14. The program method as claimed in claim 13, wherein the additionally removing electrons to the corresponding bit line includes
    setting the voltages of all or some of the word lines to a first word line voltage less than the pass voltage;
    supplying a positive pulse voltage to all or some of the word lines sequentially; and
    setting the outer-most word line toward the bit line to the first word line voltage.

15. The program method as claimed in claim 14, wherein, when all or some of the word lines are set to the first word line voltage, the outer-most word line is set to a second word line voltage which is smaller than the pass voltage, the first word line voltage being one of the ground voltage and a negative voltage.

16. The program method as claimed in claim 15, wherein the positive pulse voltage has the same level as the second word line voltage.

17. The program method as claimed in claim 13, wherein the additionally removing electrons to the corresponding bit line includes
    setting the voltages of the all or some of the word lines to a first word line voltage smaller than the pass voltage and changing the voltages of the all or some of the word lines to a second word line voltage sequentially, the second word line voltage being one of the ground voltage and a negative voltage.

18. The program method as claimed in claim 17, wherein an outer-most word line toward a bit line and at least one of all or some of the word lines are set to the second word line voltage at the same time.

19. The program method as claimed in claim 13, wherein the second word line bias condition is determined to form a potential well stepwise at each channel of the plurality of memory cells corresponding to all or some of the word lines.

20. The program method as claimed in claim 13, wherein the additionally removing electrons to the corresponding bit line includes setting the voltage of an outer-most word line toward a bit line to a first word line voltage and the remaining word lines to a second word line voltage;

setting all or some of the word lines to the first word line voltage smaller than the pass voltage;

supplying a positive pulse voltage to the all or some of the word lines sequentially; and setting the outer-most word line toward the bit line to the first word line voltage.

* * * * *